United States Patent
Martin

(10) Patent No.: US 7,319,315 B2
(45) Date of Patent: Jan. 15, 2008

(54) VOLTAGE VERIFICATION UNIT

(75) Inventor: Edward J. Martin, Virginia Beach, VA (US)

(73) Assignee: Jefferson Science Associates, LLC, Newport News, VA (US)

( * ) Notice: Subject to any disclaimer, the term of this patent is extended or adjusted under 35 U.S.C. 154(b) by 0 days.

(21) Appl. No.: 11/516,686

(22) Filed: Sep. 6, 2006

(65) Prior Publication Data

US 2007/0103164 A1    May 10, 2007

Related U.S. Application Data

(60) Provisional application No. 60/715,097, filed on Sep. 8, 2005.

(51) Int. Cl.
*G01R 31/02* (2006.01)

(52) U.S. Cl. .................................. 324/72.5; 324/73.1

(58) Field of Classification Search ............... 324/72.5, 324/73.1
See application file for complete search history.

(56) References Cited

U.S. PATENT DOCUMENTS 5,986,557 A * 11/1999 Clarke ..................... 340/638

* cited by examiner

*Primary Examiner*—Vincent Q. Nguyen

(57) ABSTRACT

A voltage verification unit and method for determining the absence of potentially dangerous potentials within a power supply enclosure without Mode 2 work is disclosed. With this device and method, a qualified worker, following a relatively simple protocol that involves a function test (hot, cold, hot) of the voltage verification unit before Lock Out/Tag Out and, and once the Lock Out/Tag Out is completed, testing or "trying" by simply reading a display on the voltage verification unit can be accomplished without exposure of the operator to the interior of the voltage supply enclosure. According to a preferred embodiment, the voltage verification unit includes test leads to allow diagnostics with other meters, without the necessity of accessing potentially dangerous bus bars or the like.

4 Claims, 4 Drawing Sheets

US 7,319,315 B2

VOLTAGE VERIFICATION UNIT

This application claims the benefit of U.S. Provisional Application No. 60/715,097, filed Sep. 8, 2005.

The United States of America may have certain rights to this invention under Management and Operating Contract DE-AC05-84ER 40150 from the United States Department of Energy.

FIELD OF THE INVENTION

The present invention relates to an apparatus and methods for the detection of the presence of AC voltage and more particularly to such a device that is capable of detecting the presence of such voltage within an enclosure without the need for exposing the operator to any hazardous conditions or potentials that may exist within the enclosure.

BACKGROUND OF THE INVENTION

In three phase power systems, the output of the power supply is characterized by the provision of three line voltages ($L_1$, $L_2$ and $L_3$) of 277 volts when connected to ground or neutral. When the three line voltages are interconnected, i.e. ($L_1$ to $L_2$, $L_2$ to $L_3$ and $L_1$ to $L_3$) the output is 480 volts per interconnected circuit. The presence of such high voltages poses an extremely dangerous working environment.

In traditional methods for determining the active status of such three phase electrical power supplies during lock out/tag out (LO/TO) operations, a power supply that had been locked out and tagged out (LO/TO'd) was presumed to be energized until verified otherwise through some form of testing procedure or "try" process. Such testing or trying procedures are generally characterized as Mode 2 work on an energized system. Mode 2 basically consists of probing and troubleshooting activities on energized systems and is the mode between Mode 1, working on deenergized systems and Mode 3 involving manipulative work on energized systems. The testing or "try" processes often involve actual opening of the power supply enclosure and exposing the operator to any potentials or other hazardous conditions that may exist inside of the enclosure.

The availability of an apparatus or system that obviates the need for such Mode 2 activities would significantly reduce the possibility of operator exposure to residual potentials or other hazardous conditions that might exist inside of a power supply enclosure.

Accordingly, there exists a need for a device and methods that provide a fail safe indication of the absence of potentials within a power supply enclosure without the need for Mode 2 activities to make such a determination before further maintenance or other activities are performed on the power supply within the power supply enclosure.

OBJECT OF THE INVENTION

It is therefore an object of the present invention to provide a device and a method for the fail safe determination of the presence of potentials within a power supply enclosure without the need for the performance of Mode 2 operations.

SUMMARY OF THE INVENTION

According to the present invention there is provided a voltage verification unit and method for determining the absence of potentially dangerous potentials within a power supply enclosure without Mode 2 work. Mode 2 work conventionally requires the wearing of flash-proof personal protection equipment during operations performed within a power supply enclosure while final testing is performed. With the device and method of the present invention, a qualified worker, following a relatively simple protocol that involves a function test (hot, cold, hot) of the voltage verification unit before Lock Out/Tag Out and, once the Lock Out/Tag Out is completed, testing or "trying" by simply reading a display on the voltage verification unit can be accomplished without exposure of the operator to the interior of the voltage supply enclosure and hence obviates the need for the wearing of the currently required personal protection equipment since all testing and trying is performed from outside of the enclosure without the necessity of opening the same. According to a preferred embodiment, the voltage verification unit includes test leads to allow diagnostics with other meters, without the necessity of accessing potentially dangerous bus bars or the like.

DETAILED DESCRIPTION

Figure 1:
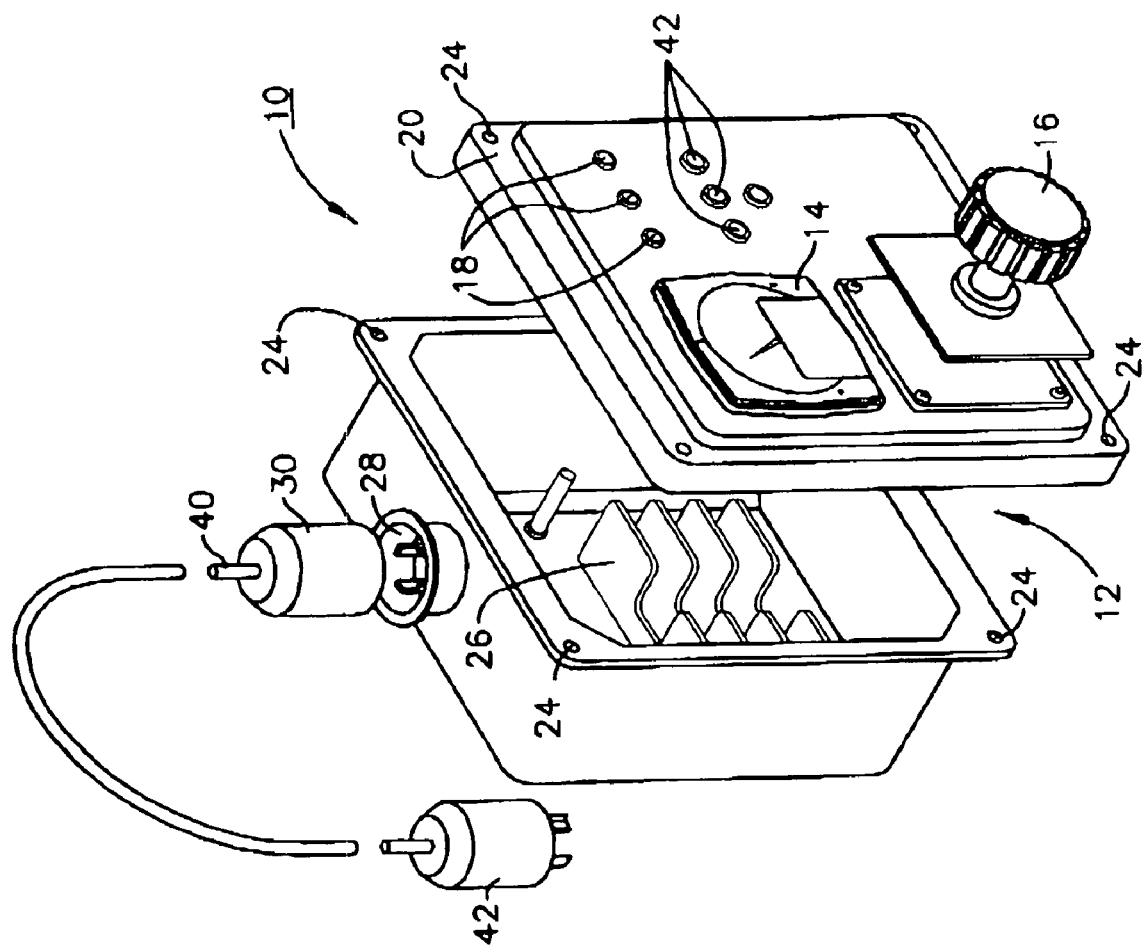
FIG. 1 is a blown-apart perspective view of the voltage verification unit of the present invention.
Figure 2:
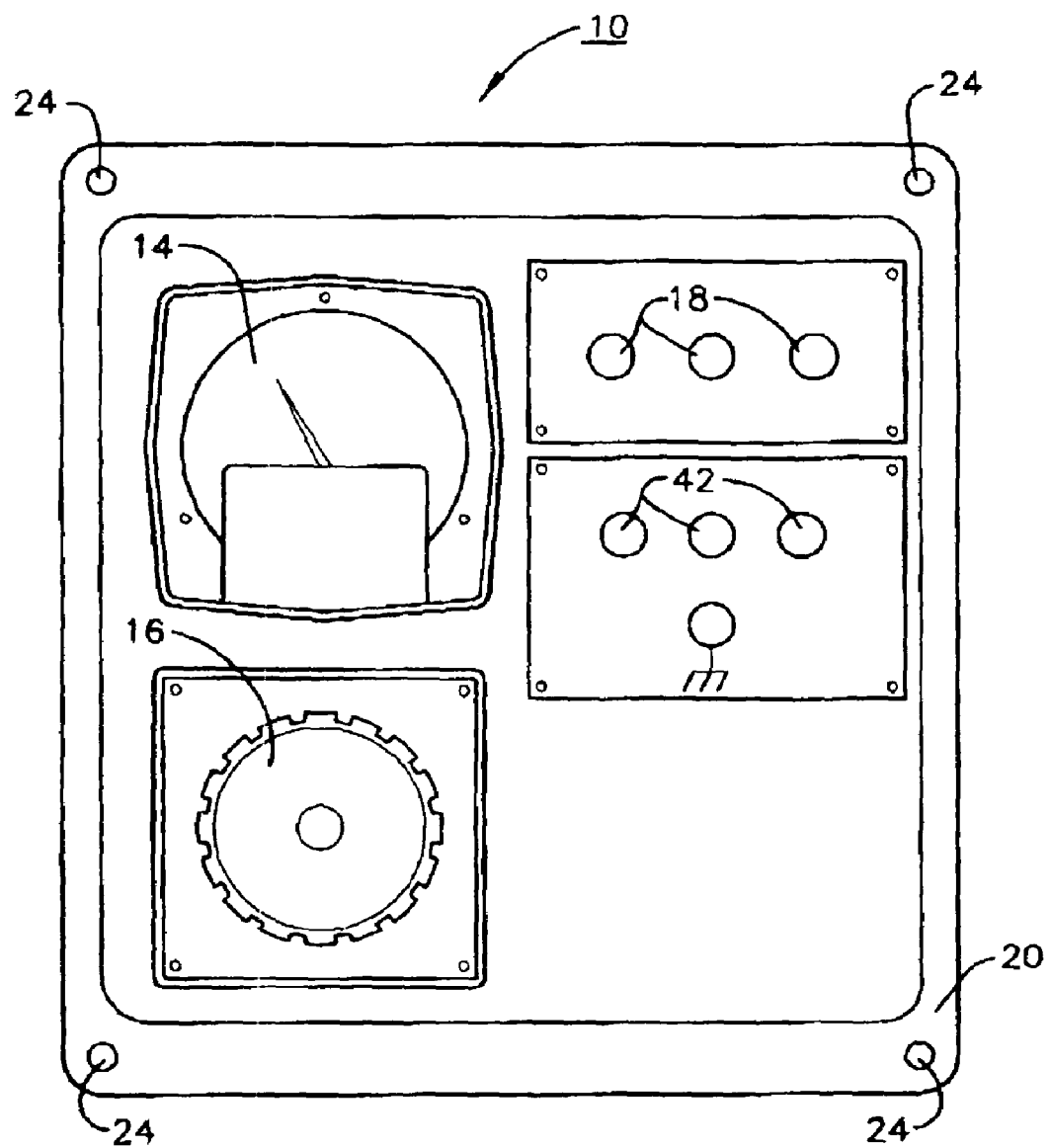
FIG. 2 is a partially phantom front view of the voltage verification unit of the present invention.

Referring now to the accompanying drawings, the voltage verification device 10 of the present invention as shown in FIGS. 1 and 2 comprises a front panel 12 incorporating a volt meter 14, a selector switch 16, and three LEDs 18 all mounted on a box closure 20. Box 22 to which box closure 20 is mounted by any appropriate means such as screws that engage apertures 24 (not shown) encloses a fuse block 26 and provides electrical access to fuse block 26 via socket 28 that can engage inlet twist lock plug 30 and is connected to second twist lock plug 42 via cable 40. Twist lock plug 38 is designed to engage a mating male plug connected to a power supply to be tested, while twist lock plug 30 provides the means for engagement of wire 40 connected to the poser supply (not shown) with the circuitry of fuse block 26. Color coded banana jacks 42 provide the means for connecting additional diagnostic tools to the circuitry of the voltage verification unit of the present invention 10. The electrical relationship of these various parts is better described in connection with FIGS. 3 and 4 below.

Figure 3:
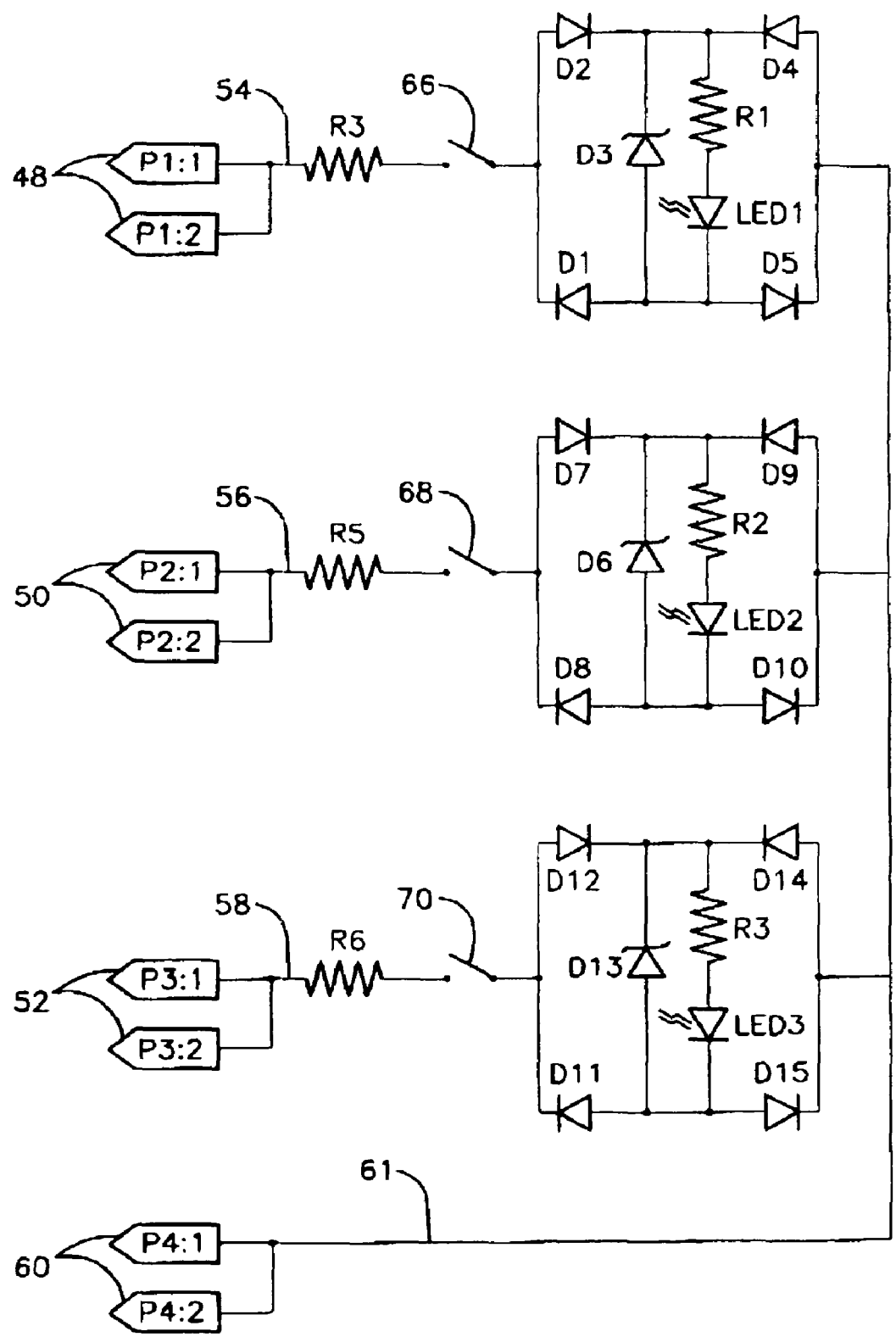
FIG. 3 is a schematic diagram of the 480 volt input circuits of the voltage verification unit of the present invention.

Shown in FIG. 3 is one embodiment of circuitry suitable for the of the voltage verification device of the present invention. It will be readily understood that many variations of such circuitry can be readily conceived and constructed to achieve the results described herein. As depicted in FIG. 3, elements 48, 50 and 52 represent 2 pin connectors that supply each of the three voltage phases 54, 56 and 58 supplied by a power supply (not shown) as delivered to verification device 10 of the present invention via twist locks plug 48 and 30 (see FIG. 4) while element 60 depicts a 2 pin connector that provides the connection to ground and defines the ground circuit 61. In the embodiment depicted in FIG. 3 each of resistors R1, R2 and R3 are rated at 12,000 microfarads and ½ watt while resistors R4, R5 and R6 are rated at 100,000 microfarads and 10 watts. Each of variable capacitors D3, D8 and D15 are rated at 10 volts and indicated 1N6271A. LEDs 1, 2, and 3 of FIG. 3 correspond to LEDS 18 depicted in FIGS. 1 and 2. Switches 66, 68 and 70 are controlled by selector switch 16 that permits individual or combined testing of each of the three voltage phases.

Figure 4:
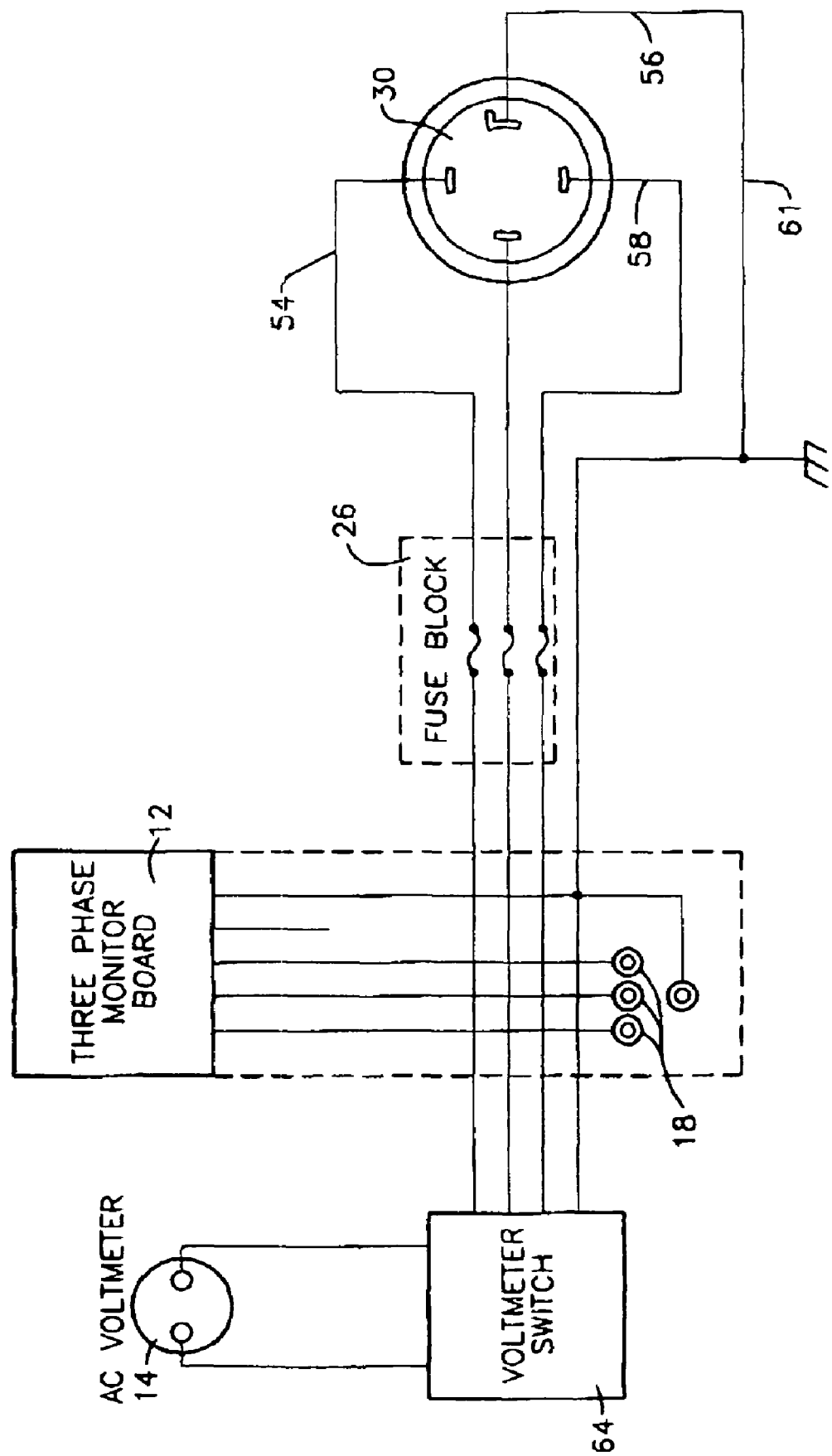
FIG. 4 is a schematic wiring diagram of the voltage verification unit of the present invention.

Referring now to FIG. 4 that schematically depicts the overall interconnectivity of the voltage verification device of the present invention, the voltage verification device of the present invention includes a volt meter 14 including a switch 64 which allows for introduction or removal of voltmeter 14 from the circuitry for testing and verification purposes. Intermediate voltmeter switch 64 and twist lock plug 30 that delivers three phase power from the power supply to voltmeter switch 64 is fuse block 26 that provides overload protection for voltmeter 14. One half amp glass fuses are suitable in this application. Three phase monitor board 12 incorporates LEDs 18 that provide a visual indicator of the presence or absence of voltage in each of the three phases of the supplied voltages. It will be readily apparent to the skilled artisan, that in lieu of or in addition to the LED indicators, audible or other alerting devices may be provided without varying from the spirit and scope of the present invention.

In use the voltage verification device 10 of the present invention is utilized as follows by activation from outside of the poser supply enclosure: 1) with the power from the power supply on, verify through the turning of switch 16 that all incoming voltages are correct and that all LEDs are lit in the appropriate phase; 2) de-energize and lock out power supply in accordance with conventional and appropriate procedures; 3) with the power off in the lock out condition, verify that all phase LEDs are off and that voltage readings on voltmeter 14 are zero for all phases. If any verification indicates that all phases or systems are other than de-energized investigate before opening/entering the poser supply enclosure.

While the voltage verification device of the resent invention has been described as incorporating a series of three indicators, preferably LEDs, it will be readily apparent to the skilled artisan that additional indicators of the same or different type may incorporated for, for example, reading each of the out puts of the individual 277 volt outputs of the three phase power supply.

There have thus been described: a) a voltage verification device for the fail safe determination of the de-energization of a three phase power supply without the need for entering the power supply enclosure; and b) a procedure for the utilization of such a device for the safe and secure determination of proper lock out tag out for such a power supply.

As the invention has been described, it will be apparent to those skilled in the art that the same may be varied in many ways without departing from the spirit and scope of the invention. Any and all such modifications are intended to be included within the scope of the appended claims.

What is claimed is:

1. A voltage verification device comprising:
   a. a series of at least three indicators;
   b. a mechanism for connecting each individually or all of said indicators to each of the three phase outputs of a three phase power supply comprising: at least one plug for engaging the output of said three phase power supply; circuitry for controllably conveying each or all of said three voltage phases from said at least one plug to said series of indicators and a switch for selecting individual of collective combinations of each of said three phase voltages for delivery to said series of indicators; and
   c. a mechanism for delivering the three phases of voltage from said three phase power supply to said series of three indicators.

2. The voltage verification device of claim 1 further including a voltmeter that includes a switch for selectively introducing or excluding the output of said three phase power supply to said voltmeter.

3. The voltage verification device of claim 2 further including a fuse block between said voltmeter and said output from said three phase power supply for the protection of said volt meter.

4. The voltage verification device of claim 1 wherein said series of indicators comprises a set of three LEDs and said circuitry for controllably conveying each or all of said three voltage phases from said at least one plug to said series of indicators and a switch for selecting individual of collective combinations of each of said three phase voltages includes an appropriate arrangement of capacitors and resistors to apply the appropriate activation voltages to said set of three LEDs.

* * * * *